United States Patent
Zheng

(10) Patent No.: US 9,217,902 B1
(45) Date of Patent: Dec. 22, 2015

(54) ARRAY SUBSTRATE AND LIQUID CRYSTAL DISPLAY PANEL

(71) Applicant: Shenzhen China Star Optoelectronics Technology Co., Ltd., Shenzhen, Guangdong (CN)

(72) Inventor: Hua Zheng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/396,054

(22) PCT Filed: Sep. 29, 2014

(86) PCT No.: PCT/CN2014/087792
§ 371 (c)(1),
(2) Date: Oct. 21, 2014

(51) Int. Cl.
*G02F 1/136* (2006.01)
*G02F 1/1362* (2006.01)
*G02F 1/1368* (2006.01)
*G02F 1/1335* (2006.01)
*H01L 27/12* (2006.01)

(52) U.S. Cl.
CPC ........ *G02F 1/136213* (2013.01); *G02F 1/1368* (2013.01); *G02F 1/133514* (2013.01); *G02F 1/136227* (2013.01); *G02F 1/136286* (2013.01); *H01L 27/124* (2013.01); *H01L 27/1218* (2013.01); *H01L 27/1255* (2013.01)

(58) Field of Classification Search
CPC .................... G02F 1/136213; G02F 1/136286
See application file for complete search history.

(56) References Cited

U.S. PATENT DOCUMENTS

2007/0291191 A1* 12/2007 Liu .................. G02F 1/136213
349/38

* cited by examiner

*Primary Examiner* — Phu Vu
(74) *Attorney, Agent, or Firm* — Andrew C. Cheng

(57) ABSTRACT

The present invention provides an array substrate and a liquid crystal display panel. In the array substrate, with regard to storage capacitors corresponding to one scan line, a capacitance value of the storage capacitor(s) corresponding to the middle of the scan line is smaller than the capacitance value of each of the storage capacitors corresponding to two ends of the scan line, and thereby when data lines input voltage signals, a voltage difference between a pixel electrode(s) of the storage capacitor(s) corresponding to the middle of the scan line and the pixel electrodes of the storage capacitors corresponding to the two ends of the scan line is smaller than a threshold value. By the above described manner, the present invention can improve the uniformity of image brightness.

13 Claims, 6 Drawing Sheets

ARRAY SUBSTRATE AND LIQUID CRYSTAL DISPLAY PANEL

TECHNICAL FIELD

The present invention relates to the field of liquid crystal display technology, and particularly to an array substrate and a liquid crystal display panel.

DESCRIPTION OF RELATED ART

The liquid crystal display panel has advantages of excellent color performance, wide viewing angle, high contrast and so on, and thus has broad market prospects.

As shown in FIG. 1, a liquid crystal display panel 11 generally is driven to display by data drivers 12 and scan drivers 13 arranged at the periphery thereof. Scan signals on one scan line are inputted by the scan drivers 13 respectively connected with two ends of the scan line, so as to control thin film transistors (TFTs) connected with the scan line to be turned on, and then the data drivers 12 can input voltage signals needed by image display to pixel electrodes 14 of the liquid crystal display panel 11 through the turned-on thin film transistors, the display of the liquid crystal display panel 11 is achieved as a result.

However, since the RC delay of signals on the scan line, waveforms of the scan signals inputted to the scan line are distorted, i.e., when the scan signals with original normal waveforms inputted from the two ends of the scan line are transmitted toward the middle of the scan line, suffering from the RC delay influence of the scan line, the scan signals are gradually decreased, and the degree of decrease of the scan signals is more serious when the scan signals reach the middle of the scan line, so that charging ratios of the pixel electrodes 14 in the middle of the liquid crystal display panel 11 are reduced, and voltages 15 of the pixel electrodes 14 in the middle of the liquid crystal display panel 11 are lower than voltages 16 of the pixel electrodes 14 at two sides of the liquid crystal display panel 11, resulting in that a brightness in the middle of the liquid crystal display panel 11 is lower than brightnesses at the two sides of the liquid crystal display panel 11, i.e., the liquid crystal display panel 11 appears the phenomenon of "two sides being whity", the brightness uniformity of the liquid crystal display panel 11 is degraded consequently.

SUMMARY

Accordingly, a technical problem primarily is solved by the present invention is to provide an array substrate and a liquid crystal display panel, so as to improve the uniformity of image brightness.

In order to solve the above described technical problem, a technical solution proposed by the present invention is to provide an array substrate. The array substrate includes scan lines, data lines, thin film transistors and storage capacitors. The storage capacitors are formed by pixel electrodes and common electrodes. Gates of the thin film transistors are connected with the scan lines, sources of the thin film transistors are connected with the data lines, drains of the thin film transistors are connected with the pixel electrodes of the storage capacitors, and the thin film transistors each have a horseshoe-shaped structure. In the storage capacitors corresponding to one of the scan lines, capacitance values of the storage capacitors are progressively increased from the middle of the scan line to each of two ends of the scan line at intervals of a predetermined distance, the capacitance values of the storage capacitors within a same predetermined distance are equal to each other, and thereby the capacitance value of the storage capacitor(s) corresponding to the middle of the scan line is smaller than the capacitance value of each of the storage capacitors corresponding to the two ends of the scan line, so that when the data lines input voltage signals, a voltage difference between the pixel electrode(s) of the storage capacitor(s) corresponding to the middle of the scan line and the pixel electrodes of the storage capacitors corresponding to the two ends of the scan line is smaller than a threshold value.

In an exemplary embodiment, overlapping areas of the pixel electrodes with the common electrodes of the storage capacitors are progressively increased from the middle of the scan line to each of the two ends of the scan line at intervals of the predetermined distance, and the overlapping areas of the pixel electrodes with the common electrodes of the storage capacitors within a same predetermined distance are equal to each other.

In an exemplary embodiment, the capacitance values of the storage capacitors are progressively increased with 2% from the middle of the scan line to each of the two ends of the scan line at intervals of the predetermined distance.

In order to solve the above described technical solution, another technical solution proposed by the present invention is to provide an array substrate. The array substrate includes scan lines, data lines, thin film transistors and storage capacitors. The storage capacitors are formed by pixel electrodes and common electrodes. Gates of the thin film transistors are connected with the scan lines, sources of the thin film transistors are connected with the data lines, and drains of the thin film transistors are connected with the pixel electrodes of the storage capacitors. In the storage capacitors corresponding to one of the scan lines, a capacitance value of the storage capacitor(s) corresponding to the middle of the scan line is smaller than the capacitance value of each of the storage capacitors corresponding to two ends of the scan line, and thereby when the data lines input voltage signals, a voltage difference between the pixel electrode(s) of the storage capacitor(s) corresponding to the middle of the scan line and the pixel electrodes of the storage capacitors corresponding to the two ends of the scan line is smaller than a threshold value.

In an exemplary embodiment, in the storage capacitors corresponding to one of the scan lines, the capacitance values of the storage capacitors are progressively increased from the middle of the scan line to each of the two ends of the scan line at intervals of a predetermined distance, and the capacitance values of the storage capacitors within a same predetermined distance are equal to each other.

In an exemplary embodiment, overlapping areas of the pixel electrodes with the common electrodes of the storage capacitors are progressively increased from the middle of the scan line to each of the two ends of the scan line at intervals of the predetermined distance, and the overlapping areas of the pixel electrodes with the common electrodes of the storage capacitors within a same predetermined distance are equal to each other.

In an exemplary embodiment, the capacitance values of the storage capacitors are progressively increased with 2% from the middle of the scan line to each of the two ends of the scan line at intervals of the predetermined distance.

In an exemplary embodiment, in the storage capacitors corresponding to one of the scan lines, the capacitance values of the storage capacitors are successively increased from the middle of the scan line to each of the two ends of the scan line.

In order to solve the above described technical problem, still another technical solution proposed by the present invention is to provide a liquid crystal display panel. The liquid crystal display panel includes an array substrate, a color filter substrate and a liquid crystal layer arranged between the array substrate and the color filter substrate. The array substrate includes scan lines, data lines, thin film transistors and storage capacitors. The storage capacitors are formed by pixel electrodes and the common electrodes. Gates of the thin film transistors are connected with the scan lines, sources of the thin film transistors are connected with the data lines, and drains of the thin film transistors are connected with the pixel electrodes of the storage capacitors. In the storage capacitors corresponding to one of the scan lines, a capacitance value of the storage capacitor(s) corresponding to the middle of the scan line is smaller than the capacitance value of each of the storage capacitors corresponding to two ends of the scan line, and thereby when the data lines input voltage signals, a voltage difference between the pixel electrode(s) of the storage capacitor(s) corresponding to the middle of the scan line and the pixel electrodes of the storage capacitors corresponding to the two ends of the scan line is smaller than a threshold value.

In an exemplary embodiment, in the storage capacitors corresponding to one of the scan lines, the capacitance values of the storage capacitors are progressively increased from the middle of the scan line to each of the two ends of the scan line at intervals of a predetermined distance, and the capacitance values of the storage capacitors within a same predetermined distance are equal to each other.

In an exemplary embodiment, overlapping areas of the pixel electrodes with the common electrodes of the storage capacitors are progressively increased from the middle of the scan line to each of the two ends of the scan line at intervals of the predetermined distance, and the overlapping areas of the pixel electrodes with the common electrodes of the storage capacitors within a same predetermined distance are equal to each other.

In an exemplary embodiment, the capacitance values of the storage capacitors are progressively increased with 2% from the middle of the scan line to each of the two ends of the scan line at intervals of the predetermined distance.

In an exemplary embodiment, in the storage capacitors corresponding to one of the scan lines, the capacitance values of the storage capacitors are successively increased from the middle of the scan line to each of the two ends of the scan line.

Beneficial effects can be achieved by the present invention are that: compared with the prior art, in the array substrate of the present invention, by setting the storage capacitors corresponding to different positions of a scan line to have different capacitance values, a voltage difference between the pixel electrodes corresponding to the different positions of the scan line is smaller than a threshold value, and thereby voltages of the pixel electrodes corresponding to the different positions are substantially equal to each other. As a result, brightnesses of display image corresponding to the different positions of the scan line are substantially the same, and the uniformity of image brightness is improved.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the present invention, technical solutions in the embodiments of the present invention will be clearly and completely described. Apparently, the embodiments of the present invention described below only are a part of embodiments of the present invention, but not all embodiments. Based on the described embodiments of the present invention, all other embodiments obtained by ordinary skill in the art without creative effort belong to the scope of protection of the present invention.

Figure 1:
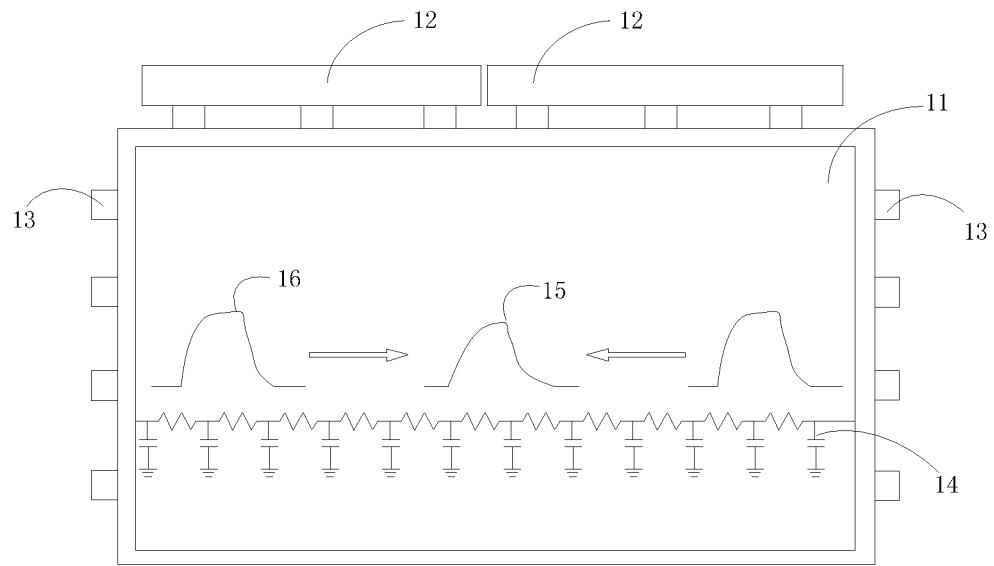
FIG. 1 is a voltage waveform diagram of pixel electrodes of a liquid crystal display panel in the prior art.
Figure 2:
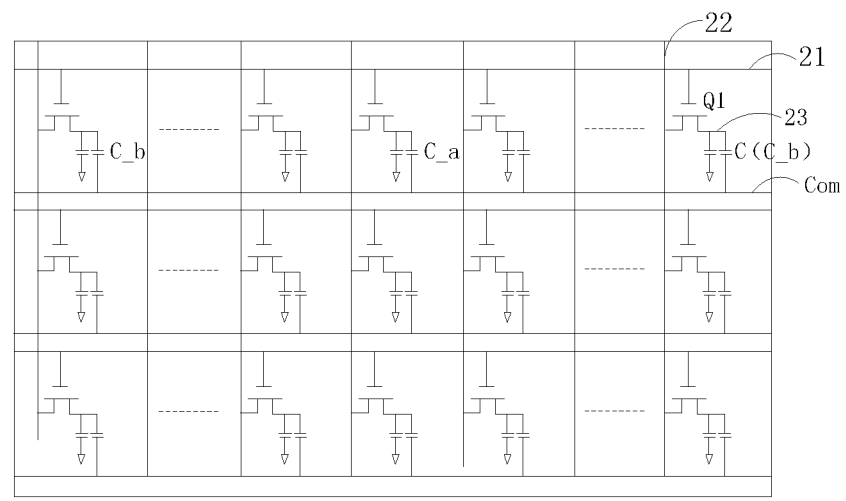
FIG. 2 is an equivalent circuit diagram of an embodiment of pixel structures of an array substrate according to the present invention.

Referring to FIG. 2, FIG. 2 is an equivalent circuit diagram of pixel structures in an embodiment of an array substrate according to the present invention. The array substrate includes scan lines 21, data lines 22, storage capacitors C and thin film transistors Q1. The scan lines 21 are arranged intersecting with the data lines 22. One storage capacitor C, one thin film transistor Q1 and mutually-intersected one scan line 21 and one data line 22 together define one pixel structure. The array substrate includes multiple (i.e., more than one) pixel structures arranged in an array. The storage capacitors C each are formed by a pixel electrodes 23 and a common electrode Com.

Gates of the thin film transistors Q1 are connected with the scan lines 21, sources of the thin film transistors Q1 are connected with the data lines 22, and drains of the thin film transistors Q1 are connected with the pixel electrodes 23 of the storage capacitors C. When driving the pixel electrodes 23 to achieve image display, scan drivers (not shown in FIG. 2) at two ends of each scan line 21 supply scan signals respectively from the two ends of the scan line 21 to the scan line 21 so as to control the thin film transistors Q1 to be turned on, the data lines 22 then can input voltage signals needed by image display to the pixel electrodes 23 through the turned-on thin film transistors Q1 so as to charge the storage capacitors C, and thereby the image display is achieved.

Each of the scan lines 21 is for driving a row of pixel electrodes 23, a row of storage capacitors C are charged by the cooperation of one scan line 21 and multiple (i.e., more than one) data lines 22, and one scan line 21 is corresponding to a row of storage capacitors C. In all the storage capacitors C corresponding to one of the scan lines 21, a capacitance value of the storage capacitor(s) C_a corresponding to the middle of the scan line 21 is smaller than the capacitance value of each of the storage capacitors C_b corresponding to two ends of the scan line 21. The storage capacitor(s) C_a corresponding to the middle of the scan line 21 is/are the storage capacitor(s) C_a connected with the thin film transistor(s) Q1 being connected with the middle of the scan line 21, and the storage capacitors C_b corresponding to the two ends of the scan line 21 are the storage capacitors C_b connected with the thin film transistors Q1 being connected with the two ends of the scan line 21. Herein, only a row of storage capacitors C corresponding to one scan line 21 are taken as an example for the purpose of illustration, it is understood that the row of storage capacitors C corresponding to any one of the other scan lines may have the above described characteristic.

The larger the storage capacitor C is, the pixel electrode 23 is more difficult to be charged to a saturation state (i.e., a voltage of data line 22), and correspondingly the lower a charging ratio of the pixel electrode is. Whereas, the smaller the storage capacitor C is, the pixel electrode 23 is easier to reach the saturation state, and correspondingly the higher the charging ratio of the pixel electrode 23 is. The charging ratio of the pixel electrode 23 is a ratio of the voltage of the pixel electrode 23 to a voltage of the data line 22; and in the ideal case, after the data line 22 charges the pixel electrode 23, the voltage of the pixel electrode 23 ought to reach the voltage of the data line 22.

It is indicated that, in FIG. 2, only one storage capacitor is labeled as the storage capacitor(s) C_a corresponding to the middle of the scan line 21, but it does not mean that the storage capacitor(s) C_a corresponding to the middle of the scan line 21 in this embodiment only is the storage capacitor C_a connected with one thin film transistor Q1 being connected with the midpoint of the scan line 21, and may multiple (i.e., more than one) storage capacitors C_a corresponding to the middle portion of the scan line 21 with more serious distortion of scan signal. The storage capacitors C_b respectively corresponding to the two ends of the scan line 21 are configured in the same way.

In the prior art, capacitance values of all the storage capacitors generally are the same, resulting from the RC delay of scan line, scan signals reaching the middle of the scan line are smaller than the scan signals at two ends of the scan line, i.e., the scan signals at the middle of the scan line have more serious distortion, so that a voltage of the pixel electrode(s) corresponding to the middle of the scan line is much lower than a voltage of each of the pixel electrodes corresponding to the two ends of the scan line after the data lines charging the pixel electrodes, causing the phenomenon of "two sides being whity". The smaller the scan signal is, the lower the charging ratio of the pixel electrode is; but the smaller the capacitance value of the storage capacitor is, the higher the charging ratio of the pixel electrode is. In this embodiment, the storage capacitor(s) C_a corresponding to the middle of the scan line 21 is/are given a relatively small capacitance value while the storage capacitors C_b corresponding to the two ends of the scan line 21 are given a relatively large capacitance value, so as to deal with different degrees of distortion for the scan signals at different positions of the scan line 21 by making the storage capacitors at different positions of the scan line 21 to have different capacitance values, and thereby the difference of charging ratios of the pixel electrodes 23 corresponding to different positions of the scan line 21 is reduced, even the charging ratios tend to the same.

Figure 3:
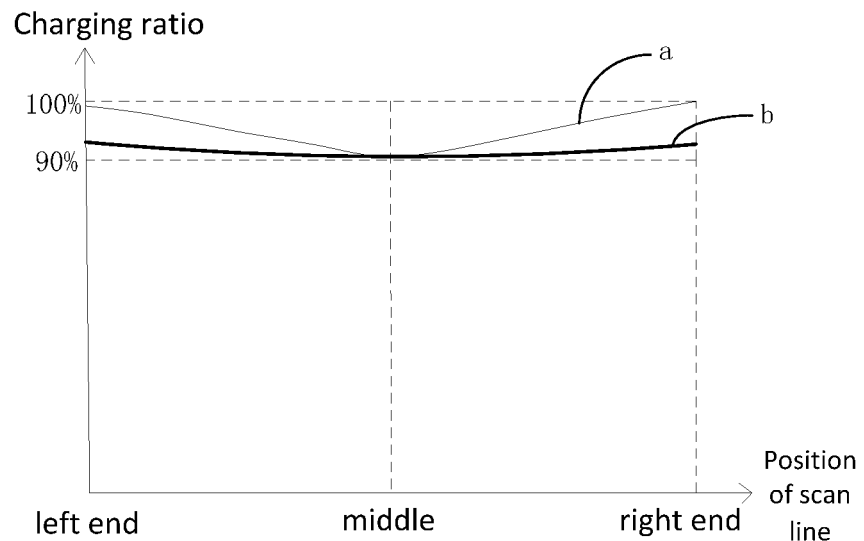
FIG. 3 is a schematic curve diagram of charging ratios of pixel electrodes in an embodiment of the array substrate according to the present invention, where a curve diagram of charging ratios of pixel electrodes in the prior art also is illustrated.
Figure 4:
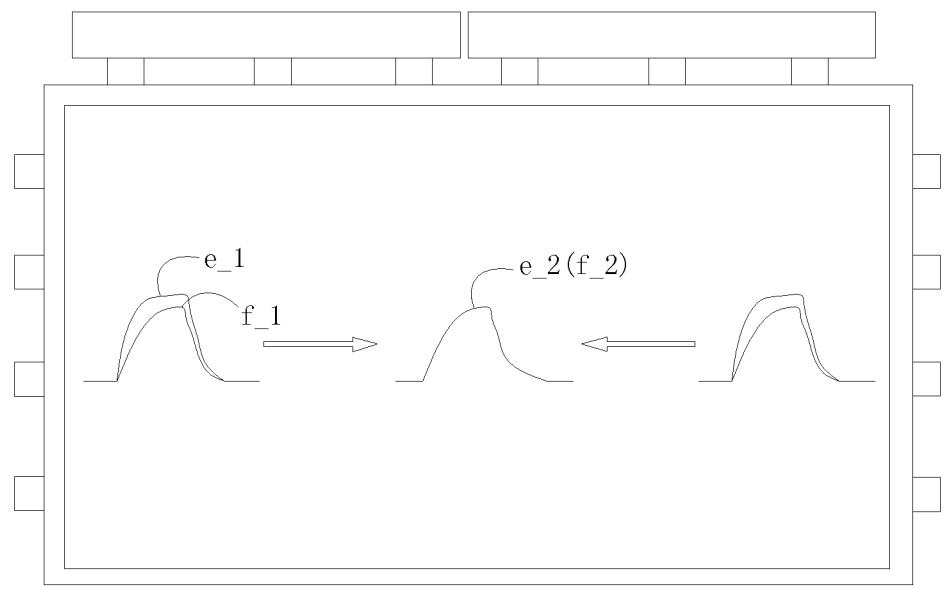
FIG. 4 is a voltage waveform diagram of pixel electrodes in an embodiment of the array substrate according to the present invention, where a voltage waveform diagram of pixel electrodes in the prior art also is illustrated.

For example, referring to FIGS. 3 and 4, FIG. 3 is a waveform diagram associated with charging ratios of pixel electrodes in this embodiment and charging ratios of pixel electrodes in the prior art, and FIG. 4 is a waveform diagram associated with voltages of pixel electrodes in this embodiment and voltages of pixel electrodes in the prior art. In FIG. 4, only the voltage waveforms of the pixel electrodes at the two sides and the middle are shown. Regarding the pixel electrodes of the prior art, suffering from the influence of RC delay of scan signal, the charging ratio of the pixel electrode(s) corresponding to the middle of scan line generally only is about 90%, while the charging ratio of the pixel electrodes corresponding to the two ends of scan line especially the pixel electrodes closest to input ends of scan signal may be up to 100%, as denoted by the curve "a" in FIG. 3. In the prior art, the voltage waveform of the pixel electrodes at the two sides and the voltage waveform of the pixel electrode(s) at the middle respectively are the waveforms e_1, e_2 as shown in FIG. 4, and as seen from the waveform diagram, the voltage of the pixel electrodes at the two sides is higher than the voltage of the pixel electrode(s) at the middle. Contradistinctively, in the embodiment of the present invention, by making the capacitance value of the storage capacitors C_b corresponding to the left and right ends of the scan line 21 to be larger than the capacitance value of the storage capacitor(s) C_a corresponding to the middle of the scan line 21, the charging ratio of the pixel electrodes 23 of the storage capacitors C_b corresponding to the left and right ends of the scan line 21 is reduced, as denoted by the curve "b" of FIG. 3, so that the charging ratio difference between the pixel electrodes 23 of the storage capacitors C_b corresponding to the left and right ends of the scan line 21 and the pixel electrode(s) 23 of the storage capacitor(s) C_a corresponding to the middle of the scan line 21 is reduced, and thereby a voltage difference between the pixel electrode(s) 23 of the storage capacitor(s) C_a corresponding to the middle of the scan line 21 and the pixel electrode 23 of the storage capacitors C_b corresponding to the two ends of the scan line 21 may be smaller than a threshold value, and thereby the voltage of the pixel electrode(s) 23 of the storage capacitor(s) C_a corresponding to the middle of the scan line 21 is approximately equal to the voltage of the pixel electrodes 23 of the storage capacitors C_b corresponding to the two ends of the scan line 21. Accordingly, when displaying an image, the image brightness corresponding to the middle of the scan line 21 is about the same as the image brightnesses corresponding to the two ends of the scan line 21, and the uniformity of image brightness is improved. In the embodiment of the present invention, the voltage waveform of the pixel electrodes 23 corresponding to the two ends of the scan line 21 and the voltage waveform of the pixel electrode(s) 23 corresponding to the middle of the scan line 21 respectively are the waveforms f_1, f_2 as shown in FIG. 4, and as seen from the voltage waveforms, it can be found that the voltage of the pixel electrodes 23 at the two sides in the embodiment of the present invention is lower than the voltage of the pixel electrodes at the two sides in the prior art, and is substantially same as the voltage of the pixel electrode(s) 23 at the middle.

In practical applications, because of the influence of factors such as manufacturing process, it may be difficult to make the voltage of the pixel electrode(s) 23 of the storage capacitor(s) C_a corresponding to the middle of the scan line 21 is exactly equal to the voltage of the pixel electrodes 23 of the storage capacitors C_b corresponding to the two ends of the scan line 21. It can be understood to the ordinary skill in the art that, according to the solution proposed by the embodiment of the present invention, the capacitance values of the storage capacitors C corresponding to different positions of the scan line 21 can be set according to the distortion degrees of scan signal, i.e., the capacitance value of the storage capacitors C_b corresponding to the two ends of the scan line 21 with slight distortion of scan signal can be set to be large, the capacitance value of the storage capacitor(s) C_a corresponding to the middle of the scan line 21 with more serious distortion of scan signal can be set to be small, and thereby making the voltage difference between the pixel electrode(s) 23 at the middle and the pixel electrodes 23 at the two sides to be as small as possible, so that the image brightness at the middle and the image brightness at the two sides tend to the same, and the uniformity of the image brightness is improved.

Figure 5:
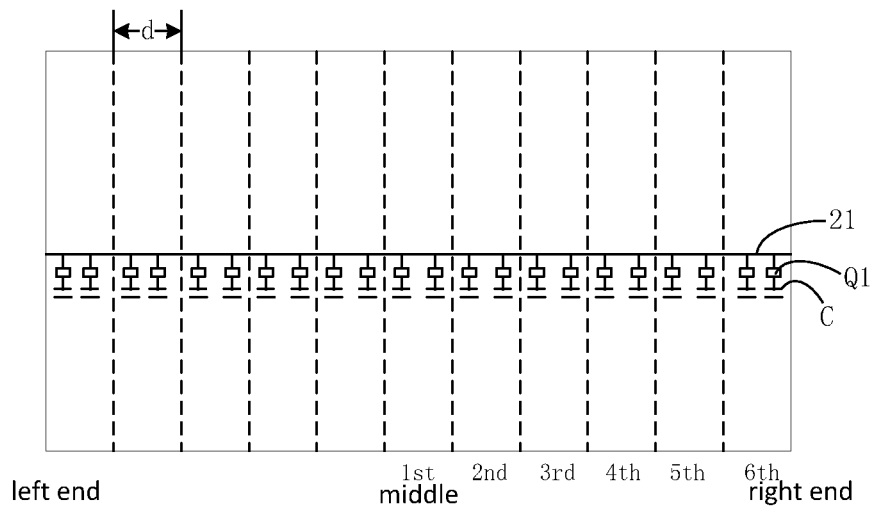
FIG. 5 is a schematic view of the array substrate being divided into multiple areas at intervals of a predetermined distance length along the lengthwise direction of a scan line in an embodiment of the array substrate according to the present invention.

The farther away from the input end of scan signal, the more serious the distortion of scan signal is. In order to further improve the uniformity of image brightness, in an embodiment of the array substrate according to the present invention, as shown in FIG. 5, in all the storage capacitors C corresponding to one scan line 21, i.e., the storage capacitors C formed by all the pixel electrodes 23 driven by one scan line 21, the capacitance values of the storage capacitors C are progressively increased from the middle of the scan line 21 to each of the two ends of the scan line 21 at intervals of a predetermined distance d, and the capacitance values of the storage capacitors C within a same predetermined distance d are the equal to each other. Generally, in a small section of the scan line 21, the difference of distortion degrees of scan signal at different positions of the scan line 21 is not significant, and thus the difference between the charging ratios of the multiple pixel electrodes 23 corresponding to the section of the scan line 21 also is not significant; the predetermined distance d in the embodiment is set to be the length of the section of the scan line 21 with non-significant difference of distortion degrees of scan signal, and the value of the distance length can be set according to the distortion degrees of scan signal.

For example, according to the distortion degrees of scan signal, the array substrate is divided into eleven areas each with the distance length of d along the lengthwise direction of the scan line 21. The middle area 1st is the area corresponding to the middle of the scan line 21, the storage capacitors C located in the middle area 1st are the storage capacitors corresponding to the middle of the scan line 21. Two most sided areas 6th are the areas respectively corresponding to the two ends of the scan line 21, and the storage capacitors C located in the two most sided areas 6th are the storage capacitors corresponding to the two ends of the scan line 21. Substrate structures at left side and right side of the middle area 1st are symmetrical, and thus only the right side substrate structure will be described below for the purpose of illustration. Accordingly, as to all the storage capacitors C corresponding to one scan line 21, the capacitance values of the storage capacitors are progressively increased from the middle area 1st to the right-most sided area 6th, and the capacitance values of the storage capacitors C within a same area are equal to each other. Accordingly, in this embodiment, the capacitance value of the storage capacitors C in the middle area 1st is the smallest, while the capacitance value of the storage capacitors C in the right-most sided area 6th is the largest.

FIG. 5 only schematically shows a section of the scan line 21 corresponding to two storage capacitors C being used as one spaced distance d. In other embodiment, according to the distortion degrees of scan signal, a section of the scan line 21 corresponding to more (e.g., ten, twenty, etc.) storage capacitors C is used as one spaced distance d.

Figure 6:
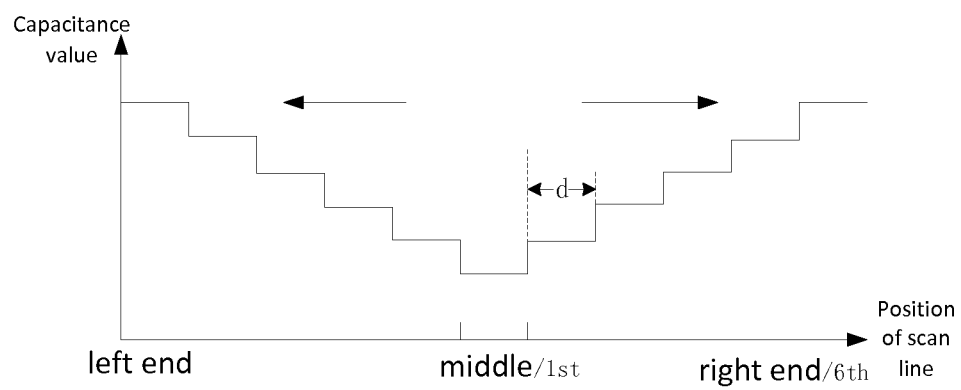
FIG. 6 is a schematic variation curve diagram of capacitance values of storage capacitors in an embodiment of the array substrate according to the present invention.

In addition, in this embodiment, as shown in FIG. 6, the capacitance values of the storage capacitors C are progressively increased in an equi-difference manner from the middle area 1st to the right-most side area 6th, i.e., a difference between the capacitance values of the storage capacitors C of each two neighboring areas is a same value. Of course, in other embodiment, the difference between the capacitance values of the storage capacitors of each two neighboring areas may be set to be different, the capacitance values of the storage capacitors C in the respective areas can be set according to the distortions of scan signal to thereby make the voltages of the pixel electrodes 23 corresponding to different distortions on the scan line 21 to be substantially equal to each other, and the uniformity of the image brightness is improved consequently.

Figure 7:
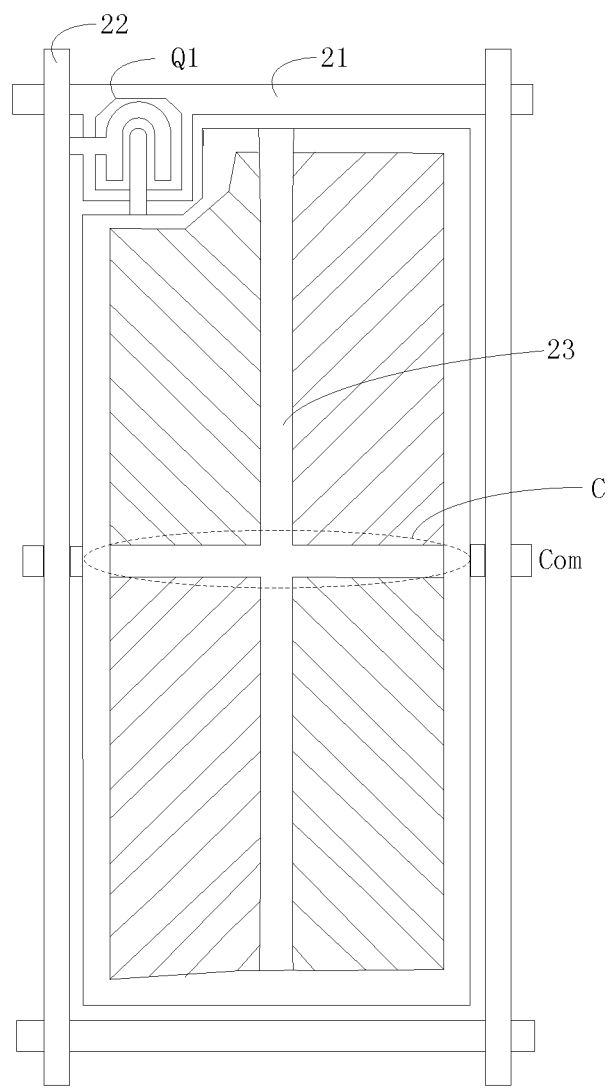
FIG. 7 is a schematic structural view of a pixel structure corresponding to the middle of a scan line in an embodiment of the array substrate according to the present invention.

The storage capacitor C concretely is formed by an overlapping portion with the common electrode Com of the pixel electrode 23, the larger of an area of the overlapping portion (also referred to as overlapping area) of the pixel electrode 23 with the common electrode Com is, the larger the capacitance value of the storage capacitor C is; whereas, the smaller of the overlapping area of the pixel electrode 23 with the common electrode Com is, the smaller the capacitance value of the storage capacitor C is. Referring to FIG. 7, in an embodiment of the array substrate according to the present invention, the thin film transistor Q1 has a horseshoe-shaped structure, and the common electrode Com is arranged under the pixel electrode 23. The pixel electrode 23 is a fishbone-shaped electrode. A main part of the pixel electrode 23 on the lengthwise direction of the scan line 21 is overlapped with the common electrode Com to form the storage capacitor C. The capacitance value of the storage capacitor C can be varied by changing the overlapping area the pixel electrode 23 with the common electrode Com of the storage capacitor C.

Figure 8:
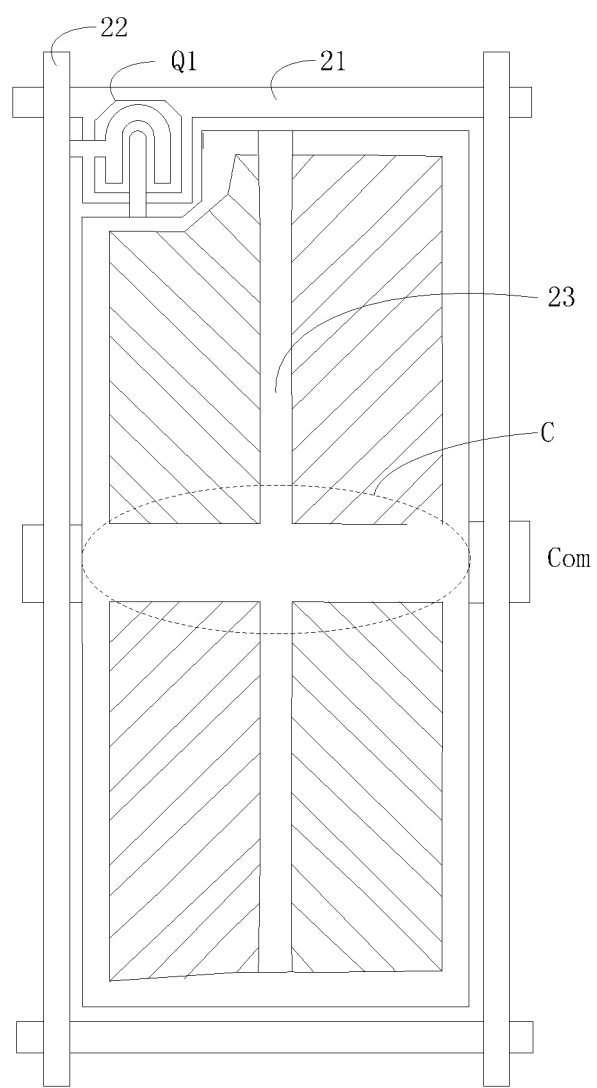
FIG. 8 is a schematic structural view of a pixel structure corresponding to two ends of a scan line in an embodiment of the array substrate according to the present invention.

Specifically, as to all the storage capacitors C corresponding to one scan line 21, the overlapping areas of the pixel electrodes with the common electrodes Com of the storage capacitors C are progressively increased from the middle of the scan line 21 to each of the two ends of the scan line 21 at intervals of the predetermined distance d, and the overlapping areas of the pixel electrodes 23 with the common electrodes Com of the storage capacitors C within a same predetermined distance d are equal to each other. That is, the overlapping areas of the pixel electrodes 23 with the common electrodes Com of the storage capacitors C are progressively increased from the middle area 1st to each of the two most sided areas 6th, and the overlapping areas of the pixel electrodes 23 with the common electrodes Com of the storage capacitors C within a same area are equal to each other. As shown in FIGS. 7 and 8, FIG. 7 a schematic structural view of a pixel structure corresponding to the middle of the scan line 21, where the elliptical portion denoted by broken line depicts the overlapping portion of the pixel electrode 23 with the common electrode Com of the storage capacitor C in the middle area 1st according to the embodiment; FIG. 8 is a schematic structural view of a pixel structure corresponding to the two ends of the scan line 21, where the elliptical portion denoted by broken line depicts the overlapping portion of the pixel electrode 23 with the common electrode Com of the storage capacitor C in the most sided areas 6th according to the embodiment. The overlapping area of the pixel electrode 23 with the common electrode Com in the most sided areas 6th is the largest, and the overlapping area of the pixel electrode 23 with the common electrode Com in the middle area 1st is the smallest.

When increasing the overlapping area of the pixel electrode 23 with the common electrode Com, the area of the main part of the pixel electrode 23 on the lengthwise direction of the scan line 21 and the area of the common electrode Com both are increased, so as to increase the overlapping area of the pixel electrode 23 with the common electrode Com.

How much the overlapping area of the pixel electrode 23 with the common electrode Com of the storage capacitor C is increased, how much the capacitance value of the storage capacitor C is increased correspondingly. In an embodiment of the present invention, the overlapping areas of the pixel electrodes 23 with the common electrodes Com of the storage capacitors C are progressively increased with 2% from the middle of the scan line 21 to each of the two ends of the scan line 21 at intervals of the predetermined distance d, and correspondingly the capacitance values of the storage capacitors C are progressively increased with 2% from the middle of the scan line 21 to each of the two ends of the scan line 21 at intervals of the predetermined distance d, as listed in the following table 1.

TABLE 1

Capacitance value increasing percentages of storage capacitors in respective areas in the right side of the array substrate

| area | 1st | 2nd | 3rd | 4th | 5th | 6th |
| --- | --- | --- | --- | --- | --- | --- |
| Capacitance value increasing percentage of C | 0 | 2% | 4% | 6% | 8% | 10% |

Accordingly, the capacitance value of the storage capacitors C in the most sided areas 6th is increased with 10% with respect to the capacitance value of the storage capacitors C in the middle area 1st.

Of course, in other embodiment, the overlapping areas of the pixel electrodes 23 with the common electrodes Com of the storage capacitors C are progressively increased with 1.5%, 3%, 5% or 5.% and so on from the middle of the scan line 21 to each of the two ends of the scan line at intervals of the predetermined distance d, one of the percentages is selected according to distortions of scan signal at different positions of the scan line 21, and thus it is not limited herein, as long as the charging ratios of the pixel electrodes 23 corresponding to different positions of the scan line 21 are made to tend to be equal to each other, so as to improve the uniformity of image brightness as a result. In addition, in other embodiment, the pixel electrode may have other shape, for example an overall strip electrode; and at this situation, when changing the overlapping area of the pixel electrode with the common electrode, the effective overlapping area of the pixel electrode with the common electrode can be varied by only changing the area of the common electrode.

In the above various embodiments, the capacitance value of the storage capacitor C is varied by changing the overlapping area of the pixel electrode 23 with the common electrode Com. In other embodiment, the capacitance value of the storage capacitor C can be varied by changing a distance between the pixel electrode 23 and the common electrode Com, the larger the distance between the pixel electrode 23 and the common electrode Com is, the smaller the capacitance value of the storage capacitor C is; whereas, the smaller the distance between the pixel electrode 23 and the common electrode Com is, the larger the capacitance value of the storage capacitor C is.

Figure 9:
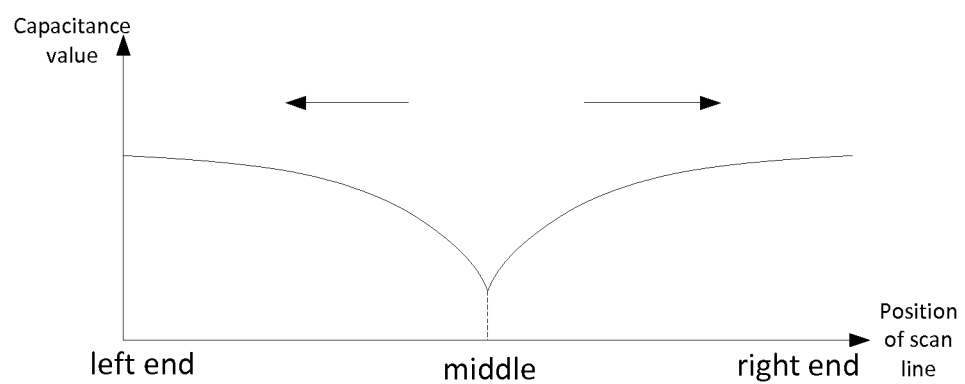
FIG. 9 is a schematic variation curve diagram of capacitance values of storage capacitors in another embodiment of the array substrate according to the present invention.

In addition, in the above various embodiments, the capacitance values of the storage capacitors C are progressively increased in a stepwise manner from the middle of the scan line to each of the two ends of the scan line, and the capacitance values of the storage capacitors C within a same area are the same. In other embodiment of the present invention, as shown in FIG. 9, in the storage capacitors corresponding to one scan line, the capacitance values of the storage capacitors may be successively increased from the middle of the scan line to each of the two ends of the scan line, for example may be successively increased in an equi-tolerance manner or successively increased in other manner; i.e., in this embodiment, the capacitance values of each two neighboring storage capacitors are different from each other, and a difference between the capacitance values of each two neighboring storage capacitors may be a same value or a different value and can be set according to the distortions of scan signal, as long as the difference of charging ratios among the pixel electrodes corresponding to different positions of the scan line is reduced. In this embodiment, the storage capacitor(s) corresponding to the middle of the scan line is the storage capacitor connected with one thin film transistor being connected to the midpoint of the scan line, and the storage capacitors corresponding to the two ends of the scan line are the storage capacitors connected with the two most sided thin film transistors respectively being connected to the two ends of the scan line.

Figure 10:
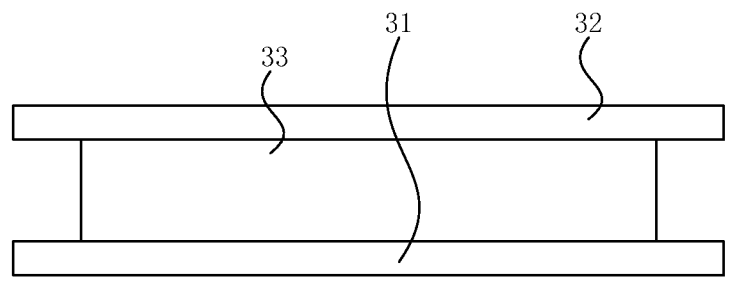
FIG. 10 is a schematic structural view of an embodiment of a liquid crystal display panel according to the present invention.

Referring to FIG. 10, in an embodiment of a liquid crystal display panel according to the present invention, the liquid crystal display panel includes an array substrate 31, a color filter substrate 32 and a liquid crystal layer 33 arranged between the array substrate 31 and the color filter substrate 32. The array substrate 31 is the array substrate of any one of the above embodiments.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An array substrate comprising scan lines, data lines, thin film transistors and storage capacitors; wherein:
    the storage capacitors are formed by pixel electrodes and common electrodes;
    gates of the thin film transistors are connected with the scan lines, sources of the thin film transistors are connected with the data lines, drains of the thin film transistors are connected with the pixel electrodes of the storage capacitors, and the thin film transistors each have a horseshoe-shaped structure;
    in the storage capacitors corresponding to one of the scan lines, capacitance values of the storage capacitors are progressively increased from the middle of the scan line to each of two ends of the scan line at intervals of a predetermined distance, the capacitance values of the storage capacitors within a same predetermined distance are equal to each other, and thereby the capacitance value of the storage capacitor(s) corresponding to the middle of the scan line is smaller than the capacitance value of each of the storage capacitors corresponding to the two ends of the scan line, so that when the data lines input voltage signals, a voltage difference between the pixel electrode(s) of the storage capacitor(s) corresponding to the middle of the scan line and the pixel electrodes of the storage capacitors corresponding to the two ends of the scan line is smaller than a threshold value.

2. The array substrate according to claim 1, wherein overlapping areas of the pixel electrodes with the common electrodes of the storage capacitors are progressively increased from the middle of the scan line to each of the two ends of the scan line at intervals of the predetermined distance, and the overlapping areas of the pixel electrodes with the common electrodes of the storage capacitors within a same predetermined distance are equal to each other.

3. The array substrate according to claim 2, wherein the capacitance values of the storage capacitors are progressively increased with 2% from the middle of the scan line to each of the two ends of the scan line at intervals of the predetermined distance.

4. An array substrate comprising scan lines, data lines, thin film transistors and storage capacitors; wherein:
the storage capacitors are formed by pixel electrodes and common electrodes;
gates of the thin film transistors are connected with the scan lines, sources of the thin film transistors are connected with the data lines, and drains of the thin film transistors are connected with the pixel electrodes;
in the storage capacitors corresponding to one of the scan lines, a capacitance value of the storage capacitor(s) corresponding to the middle of the scan line is smaller than the capacitance value of each of the storage capacitors corresponding to two ends of the scan line, and thereby when the data lines input voltage signals, a voltage difference between the pixel electrode(s) of the storage capacitor(s) corresponding to the middle of the scan line and the pixel electrodes of the storage capacitors corresponding to the two ends of the scan line is smaller than a threshold value.

5. The array substrate according to claim 4, wherein in the storage capacitors corresponding to one of the scan lines, the capacitance values of the storage capacitors are progressively increased from the middle of the scan line to each of the two ends of the scan line at intervals of a predetermined distance, and the capacitance values of the storage capacitors within a same predetermined distance are equal to each other.

6. The array substrate according to claim 5, wherein overlapping areas of the pixel electrodes with the common electrodes of the storage capacitors are progressively increased from the middle of the scan line to each of the two ends of the scan line at intervals of the predetermined distance, and the overlapping areas of the pixel electrodes with the common electrodes of the storage capacitors within a same predetermined distance are equal to each other.

7. The array substrate according to claim 5, wherein the capacitance values of the storage capacitors are progressively increased with 2% from the middle of the scan line to each of the two ends of the scan line at intervals of the predetermined distance.

8. The array substrate according to claim 4, wherein in the storage capacitors corresponding to one of the scan lines, the capacitance values of the storage capacitors are successively increased from the middle of the scan line to each of the two ends of the scan line.

9. A liquid crystal display panel comprising an array substrate, a color filter substrate and a liquid crystal layer arranged between the array substrate and the color filter substrate; wherein:
the array substrate comprises scan lines, data lines, thin film transistors and storage capacitors;
gates of the thin film transistors are connected with the scan lines, sources of the thin film transistors are connected with the data lines, and drains of the thin film transistors are connected with the pixel electrodes;
in the storage capacitors corresponding to one of the scan lines, a capacitance value of the storage capacitor(s) corresponding to the middle of the scan line is smaller than the capacitance value of each of the storage capacitors corresponding to two ends of the scan line, and thereby when the data lines input voltage signals, a voltage difference between the pixel electrode(s) of the storage capacitor(s) corresponding to the middle of the scan line and the pixel electrodes of the storage capacitors corresponding to the two ends of the scan line is smaller than a threshold value.

10. The liquid crystal display panel according to claim 9, wherein in the storage capacitors corresponding to one of the scan lines, the capacitance values of the storage capacitors are progressively increased from the middle of the scan line to each of the two ends of the scan line at intervals of a predetermined distance, and the capacitance values of the storage capacitors within a same predetermined distance are equal to each other.

11. The liquid crystal display panel according to claim 10, wherein overlapping areas of the pixel electrodes with the common electrodes of the storage capacitors are progressively increased from the middle of the scan line to each of the two ends of the scan line at intervals of the predetermined distance, and the overlapping areas of the pixel electrodes with the common electrodes of the storage capacitors within a same predetermined distance are equal to each other.

12. The liquid crystal display panel according to claim 10, wherein the capacitance values of the storage capacitors are progressively increased with 2% from the middle of the scan line to each of the two ends of the scan line at intervals of the predetermined distance.

13. The liquid crystal display panel according to claim 9, wherein in the storage capacitors corresponding to one of the scan lines, the capacitance values of the storage capacitors are successively increased from the middle of the scan line to each of the two ends of the scan line.

* * * * *